US 6,603,306 B1

(12) United States Patent
Olsson et al.

(10) Patent No.: US 6,603,306 B1
(45) Date of Patent: Aug. 5, 2003

(54) PROXIMITY SWITCH, A TARGET, A SYSTEM OF SUCH PROXIMITY SWITCHES AND TARGETS, AND A METHOD OF DETERMINING THE PRESENCE OF A TARGET BY A PROXIMITY SWITCH

(75) Inventors: Torgny Olsson, Svedala (SE); Gunnar Widell, Malmö (SE); Mats Linger, Onsala (SE)

(73) Assignee: Jokab Safety AB, Malmo (SE)

( * ) Notice: Subject to any disclaimer, the term of this patent is extended or adjusted under 35 U.S.C. 154(b) by 0 days.

(21) Appl. No.: 09/959,168

(22) PCT Filed: Apr. 17, 2000

(86) PCT No.: PCT/SE00/00726
§ 371 (c)(1),
(2), (4) Date: Feb. 8, 2002

(87) PCT Pub. No.: WO00/64053
PCT Pub. Date: Oct. 26, 2000

(30) Foreign Application Priority Data

Apr. 19, 1999 (SE) ............................................... 9901418

(51) Int. Cl.[7] ................................................. G01B 7/14
(52) U.S. Cl. ............. 324/207.26; 340/552; 324/207.17; 324/226
(58) Field of Search ............................ 324/226, 207.12, 324/207.26, 207.15, 207.16, 207.17, 260; 340/572.1, 572.2, 522, 552, 553, 554; 331/65, 74

(56) References Cited

U.S. PATENT DOCUMENTS

| 4,107,659 A | * | 8/1978 | Massa ......................... 340/552 |
| 4,771,359 A | | 9/1988 | Link |
| 5,280,288 A | * | 1/1994 | Sherry et al. ............... 342/159 |
| 5,291,152 A | | 3/1994 | Seale |
| 5,638,048 A | * | 6/1997 | Curry .......................... 340/522 |
| 6,337,625 B1 | * | 1/2002 | Taylor et al. ............... 340/541 |
| 2001/0040507 A1 | * | 11/2001 | Eckstein et al. .......... 340/572.4 |

FOREIGN PATENT DOCUMENTS

EP          0 229 247 A2    7/1987

* cited by examiner

Primary Examiner—Jay Patidar
(74) Attorney, Agent, or Firm—Nixon & Vanderhye P.C.

(57) ABSTRACT

A proximity switch for detecting a target in proximity with the proximity switch as a wireless transmitter for transmitting a first pulsed signal having a first carrier frequency to the target. The proximity switch also includes a wireless receiver for receiving a second pulsed signal having a second carrier frequency different from the first carrier frequency from the target. The proximity switch has a controller for providing an output indicative of whether a predetermined correspondence is satisfied between the first and second pulsed signals.

16 Claims, 4 Drawing Sheets

PROXIMITY SWITCH, A TARGET, A SYSTEM OF SUCH PROXIMITY SWITCHES AND TARGETS, AND A METHOD OF DETERMINING THE PRESENCE OF A TARGET BY A PROXIMITY SWITCH

TECHNICAL FIELD

The present invention relates to proximity switches of the type capable of wirelessly detecting a target in proximity with the proximity switch. The invention also relates to a target for use in combination with such a proximity switch, to a system of such proximity switches and targets, and to a method of determining the presence of a target by using a proximity switch.

DESCRIPTION OF THE PRIOR ART

Proximity switches are used in various applications for detecting the presence or absence of a second object in relation to a first object. For this purpose, the first object is provided with a proximity switch, and the second object is provided with a target, which may be detected by the proximity switch. For instance, proximity switches are commonly used in industrial and potentially dangerous environments for assisting in ensuring operational safety of a machine or an industrial process. To this end, a combination of a proximity switch and a target is used for detecting whether a gate, door, hatch, etc, is safely closed in a secure position, wherein a human operator is prohibited from directly accessing a potentially dangerous machine or process, or whether the gate, door, hatch, etc, is suddenly opened.

It is previously known to use mechanical or semi-mechanical relays or switches, for instance comprising permanent magnets and Reed switches, for monitoring gates, doors or hatches as described above. However, such switches are less desirable for various reasons. For instance, mechanical or semimechanical switches have various recesses, slots, etc. in which dirt may be accumulated. For sanitary reasons, this is not acceptable in several industrial fields, such as the food industry, the semiconductor industry or the pharmaceutical industry. Furthermore, such prior art proximity switches may be adversely affected by an external spurious magnetic field.

WO92/03876 relates to an inductive type of proximity switches, where the switch includes an open-ended loop adjacent to a coil of a parallel resonant (oscillator) circuit. A high-speed MOSFET transistor is connected between the ends of the loop, and a pulsed input to the transistor causes sequential making and breaking of a connection between these ends, wherein the loop will function as a Faraday shield to inhibit mutual inductive linking of aforesaid coil with a coil of a passive resonant circuit of a target, when said target is close to the proximity switch and the connection between the ends of the loop is made by the MOSFET transistor- The proximity switch operates by transmitting an inductive signal, which is intercepted by the passive resonant circuit of the target, wherein the critical resonant frequency of the oscillator circuit of the proximity switch will be lowered. By providing a pulsed input to the MOSFET transistor, the transistor will periodically act as an active shield, which inhibits the aforesaid influence from the passive resonant circuit of the target on the oscillator circuit of the proximity switch. Consequently, the voltage of the oscillator circuit will be lowered and raised periodically in response to the pulsed input signal to the MOSFET transistor The proximity switch of WO92/03876 has a severe drawback in that it is susceptible to a spurious external magnetic field, which may be picked up by the oscillator circuit of the proximity switch in response to the pulsed input signal to the MOSFET transistor, wherein the spurious external magnetic field will be incorrectly interpreted by the proximity switch as an indication that the target is present, even if it is not.

In one embodiment of WO92/03876 a handshaking arrangement is established for an inductive type proximity switch and its associated target. In response to receiving a signal from the proximity switch, the target is arranged to transmit to the proximity switch a predetermined pulsed signal comprising a coded set of information. The target is given its individual code once and for all, before the target is initially put into service A controller of the proximity switch monitors the received coded pulsed signal transmitted by the target, and in response thereof the controller determines whether or not the target is present in proximity of the proximity switch.

This embodiment has a drawback in that it requires a fixed, predetermined code to be programmed into the target. The code is set initially and may not be changed at a later stage. However, it is often desired to provide a cascade of several pairs of proximity switches/targets connected in series with each other, so that an output of a first proximity switch is connected to an input of a subsequent proximity switch, thereby allowing a chain of movable objects (doors, hatches, gates, etc) to be monitored in an efficient manner. However, since the code of the target is fixed and set once and for all, it may be difficult to use the proximity switches of WO92/03876 in cascade, since individual proximity switches/targets thereof may have identical codes, which may interfere with each other.

SUMMARY OF THE INVENTION

It is an object of the present invention to provide a proximity switch and an associated target, which remedy the drawbacks of the prior art solutions. In particular, it is an object of the present invention to allow a cascade of proximity switches/targets to be connected in series with each other in an efficient and reliable manner. A further object is to provide a proximity switch and a target, which are more flexible and more reliable than previously known approaches.

Yet another purpose of the present invention is to provide a proximity switch, which may be connected to and monitored by any conventional safety relay commercially available on the market.

According to the present invention, the above objects are achieved by a proximity switch, a target, a system of proximity switches and targets, and a method according to the enclosed independent patent claims.

BRIEF DESCRIPTION OF THE DRAWINGS

The present invention will be described in more detail in the following, reference being made to the accompanying drawings, in which.

DETAILED DESCRIPTION OF THE INVENTION

From an overall point of view, the present invention relates to a proximity switch for wireless detection of whether a movable object is present within a predetermined distance from the proximity switch. In order to achieve this, the movable object (which may be a door, window, gate, hatch, etc) is provided with a target, which does not have to be electrically connected to a power supply.

Figure 1:
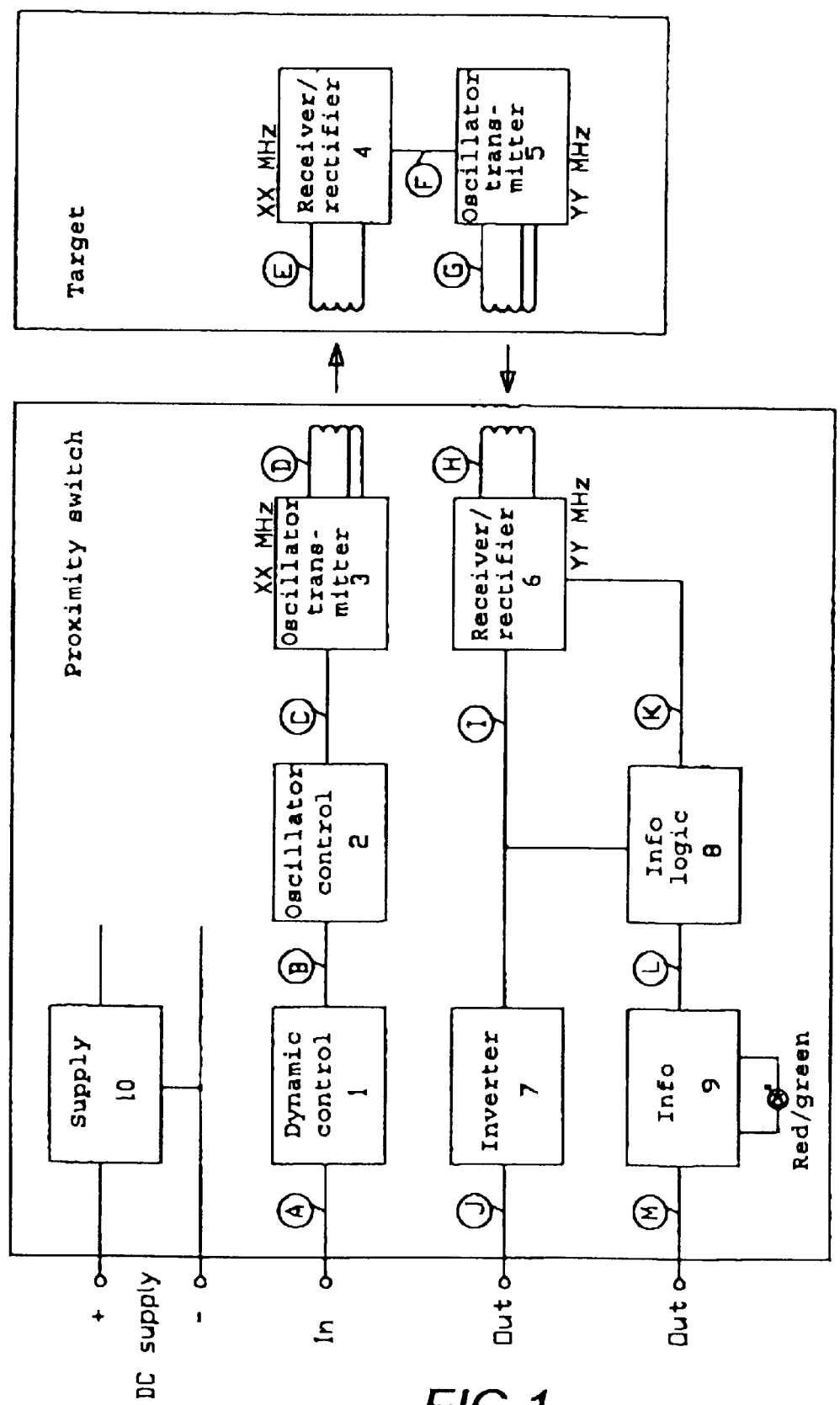
FIG. 1 is a schematic block diagram of a proximity switch and a target according to one embodiment of the invention.

A preferred embodiment of the invention is schematically illustrated in FIG. 1. The proximity switch is electrically connected to an external power supply via a pair of DC supply terminals (+ and −). A power supply module 10 in the proximity switch comprises suitable electronic circuitry for providing polarization and transient protection as well as noise reduction filters. Although not explicitly illustrated in FIG. 1, the supply module 10 is connected to other modules within the proximity switch for the purpose of supplying electric power to these other modules.

The proximity switch has an input terminal In as well first and second output terminals Out. A dynamic control module 1 is connected to the input terminal In and is adapted to receive a digital or pulsed input signal, which according to the following description will be used for driving a transmitter, so as to transmit the digital signal modulated onto a high-frequency carrier wave to the target. The target will receive the high-frequency signal and in response return another high-frequency signal, within a different frequency band, containing the same digital signal, thereby acknowledging the presence of the target in proximity with the proximity switch.

The pulsed or digital input signal may either be symmetric, e.g. a squarewave signal which preferably has a frequency of between 100 Hz and 10 kHz, or an asymmetric digital signal which switches between low and high values, representing digital values 0 and 1, respectively Consequently, if the pulsed input signal is asymmetric, the contents thereof will represent a set of digital information, which will be transmitted through the proximity switch to the target and then be returned from the target to the proximity switch, ultimately arriving at the first output terminal of the proximity switch. Hence, in this respect the proximity switch and the target are transparent to the information entered through the input terminal In. Therefore, an external device, such as any commercially available safety relay, may be connected to the input terminal In and the output terminal Out for monitoring that a digital input signal entered through the input terminal In is safely returned at the output terminal out, thereby indicating that the target is present proximate to the proximity switch.

An oscillator control module 2 is at its input connected to the dynamic control module 1 and at its output to an oscillator transmitter module 3. The purpose of the oscillator control module 2 is to prevent a static input signal having a constant low or high value from influencing the oscillator transmitter module 3. On the other hand, dynamic pulsed input signals as set out above will pass unmodified and without delay through the oscillator control module 2 to the oscillator transmitter 3.

The oscillator transmitter module 3 comprises an oscillator circuit (LC-circuit), which is tuned to a resonant frequency of a predetermined value, preferably in the MHz range. This resonant frequency, which will be the carrier frequency of the high-frequency signal transmitted from the oscillator transmitter module 3 to the target, is hereinafter referred to as XX. In the preferred embodiment, the resonant frequency XX of the oscillator transmitter 3 is 1 MHz. The oscillator circuit of the transmitter module 3 stops, when the signal supplied from the oscillator control module 2 assumes a dynamically low value, and correspondingly, when this signal goes dynamically high, the oscillator circuit of the transmitter module 3 will start. When the signal from the oscillator control module 2 is statically high or low, the oscillator will keep on oscillating. In this way, the pulsed digital signal will be modulated onto the carrier wave in an amplitude-shift keying fashion.

The target, which in a real application may be mounted at a distance of between 0 and e.g. 10 mm from the proximity switch, comprises a receiver/rectifier module 4, which is tuned to the frequency XX of the oscillator transmitter module 3 and is therefore capable of receiving a signal transmitted by the transmitter module 3, as will be described in more detail below Furthermore, as shown in more detail in FIG. 2, the receiver/rectifier module 4 comprises circuitry for rectifying the received signal and supplying it as driving energy to an oscillator transmitter module 5 in the target. The oscillator transmitter module 5 comprises an oscillator circuit (LC-circuit), which is tuned to a resonant frequency of YY MHz different from the resonant frequency XX of the oscillator transmitter module 3. The purpose of this is to avoid interference between the response signal transmitted from the proximity switch to the target and the response signal transmitted from the target to the proximity switch, as will be described below The oscillator of the oscillator transmitter module 5 starts in response to receiving energy from the receiver/rectifier module 4 and consequently stops when the supply of such energy ceases. As will appear more clearly in the following, the driving energy supplied by the receiver/rectifier module 4 will be synchronous with the digital signal modulated onto the carrier wave from the oscillator transmitter module 3 of the proximity switch. Therefore, the oscillator transmitter module 5 will be started and stopped in synchronism with the digital signal as received and demodulated by the received/rectifier module 4, so that the digital signal is modulated onto the carrier wave of the oscillator transmitter module 5 in an amplitude-shift keying fashion.

The proximity switch further comprises a receiver/rectifier module 6 having a receiver circuit tuned to the same frequency YY as the transmitter circuit of the oscillator transmitter module 5 in the target. The receiver/rectifier module 6 also comprises rectifying circuitry for rectifying and amplifying the signal received from the oscillator transmitter module 5 of the target. An output of the receiver/rectifier module 6 is supplied to an inverter module 7, which will invert the signal from the receiver/rectifier module 6, for reasons that will be apparent from the following. Furthermore, another output of the receiver/rectifier module 6 is supplied to an information logic module 8, which will process the signal received from the receiver/rectifier module 6 and control an information module 9 to provide an electric output signal (at the second output terminal Out) as well as a visual output signal (through a LED—Light Emitting Diode).

FIG. 1 has a plurality of signal nodes labelled A through M. The signal values at these signal nodes are illustrated in FIG. 3 for an exemplifying digital input signal, while a schematic circuit diagram of the proximity switch and target is given in FIG. 2. For reasons of clarity, the information logic module 8 and the information module 9 are not illustrated in the circuit diagram of FIG. 2.

The operation of the proximity switch and target according to the preferred embodiment will now be described in more detail with reference to FIGS. 1–3.

Figure 2:
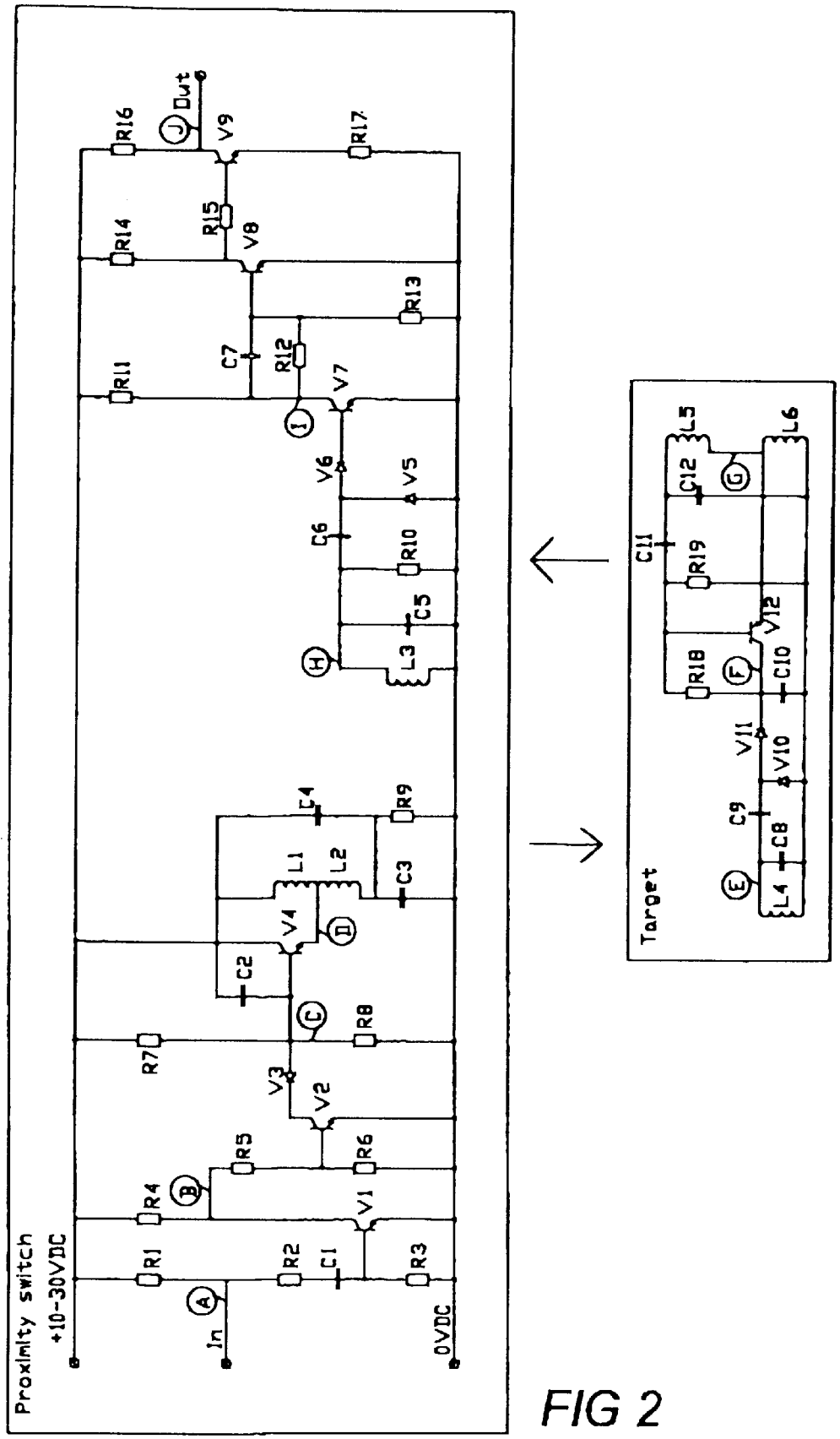
FIG. 2 is a schematic circuit diagram of portions of the proximity switch and target shown in FIG. 1.
Figure 3:
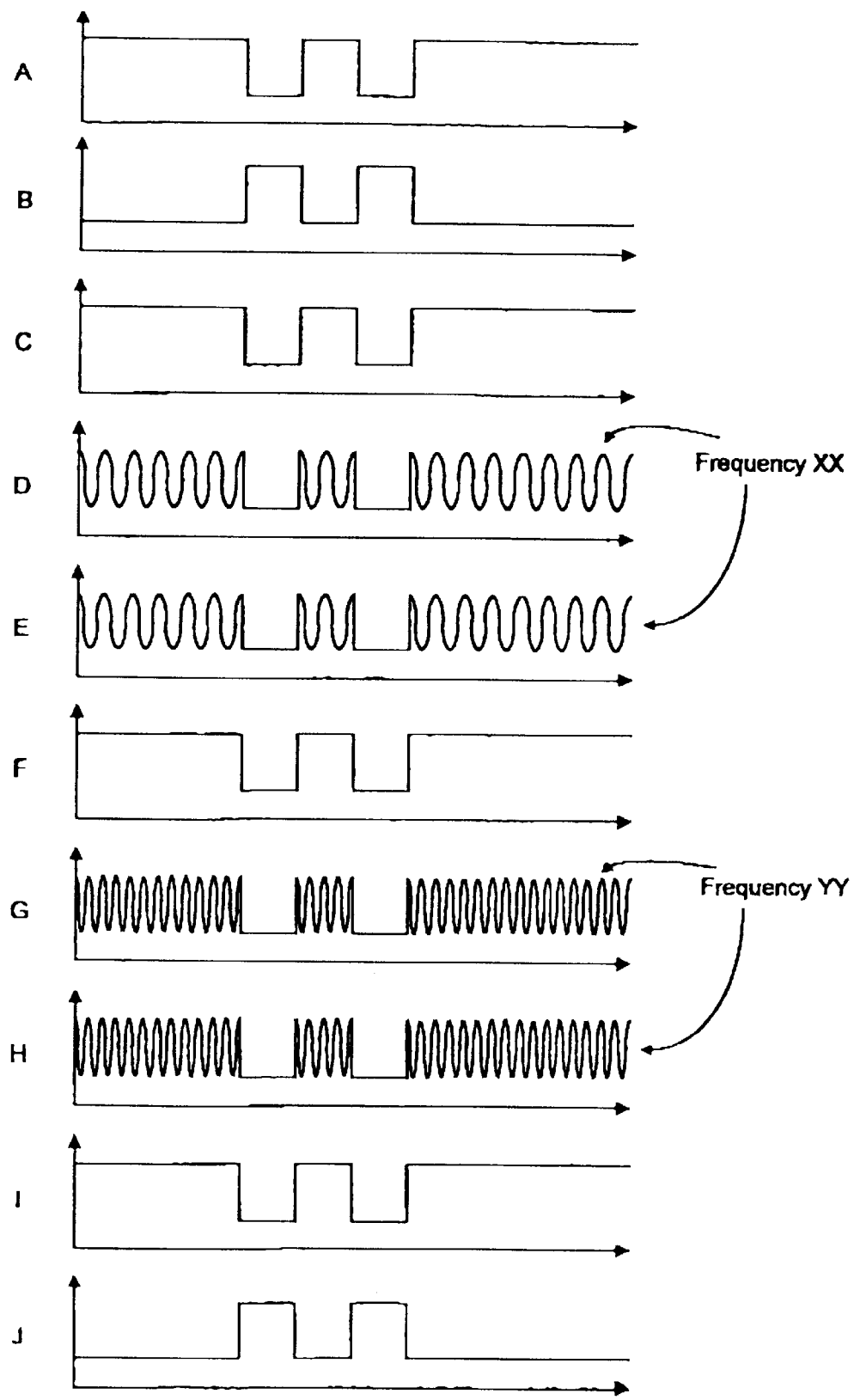
FIG. 3 is a set of diagrams illustrating the appearance of pulsed signals at selected nodes in the proximity switch and target shown in FIGS. 1 and 2.

A pulsed digital input signal is received at the input terminal In of the proximity switch (node A) and is received by the dynamic control module 1, which according to FIG. 2 comprises a resistor R2 connected in series with a capacitor C1, one end of which is connected to the base terminal of a bipolar transistor V1. Clamping resistors R1, R3 and R4 are also provided, as shown in FIG. 2. The output of the dynamic control module 1 is supplied at the collector terminal of transistor V1, to which the input of the oscillator control module 2 is connected (node B). An exemplifying illustration of a short portion of the pulsed input signal at node B is given in the second graph in FIG. 3.

As shown in FIG. 2, the oscillator control module 2 comprises a first and a second resistor R5 and R6, a bipolar transistor V2, the base terminal of which is connected to a node between resistors RS and R6, as well as a reversed diode V3, the cathode of which is connected to the collector terminal of transistor V2 and the anode of which constitutes the output of the oscillator control module 2. The pulsed signal at the output of the oscillator control module 2 is labelled C and is illustrated in the third graph of FIG. 3

The pulsed signal is received, at node C, at the input of the oscillator transmitter module 3, which comprises clamping resistors R7 and RB, a capacitor C2, a bipolar transistor V4, and an oscillator circuit comprised by a second capacitor C4, which is connected in parallel with a coil L1, L2 having an output at the center of its windings connected to the emitter terminal of a transistor V4. The oscillator circuit L1, L2, C4 is tuned to a resonant frequency of XX MHz, as previously described. The oscillator circuit is connected to one power supply line through a third capacitor C3 and a third resistor R9. The coil L1, L2 plays an active role in the oscillator circuit and also acts as a transmitter means for transmitting an essentially inductive signal D to the target. As illustrated in the fourth graph of FIG. 3, the oscillator circuit of the oscillator transmitter module 3 will start oscillating and transmitting at a high frequency of XX MHz, when the input of the oscillator circuit is either dynamically high or statically low or high. The oscillation and transmission of the oscillator circuit stops, when the input signal goes dynamically low. Therefore, the transmitter coil L1, L2 of the oscillator transmitter module 3 will start and stop in synchronism with a dynamic input signal and will transmit constantly, when the input signal is static. In effect, the pulsed signal received at input terminal In of the proximity switch will be modulated or encoded onto the high-frequency signal generated by the oscillator circuit of oscillator transmitter module 3, thereby forming, by amplitude-shift keying, a modulated signal having a carrier frequency XX, as shown at node D.

The inductive signal transmitted by aforesaid oscillator circuit is received at the target as a signal E by the receiver/rectifier module 4. As shown in FIG. 2, the receiver/rectifier module 4 of the target comprises a tuned oscillator circuit having a receiver coil L4 and a first capacitor C8 connected in parallel therewith. The oscillator circuit L4, C5 is tuned to the resonant frequency XX of the oscillator transmitter module 3 of the proximity switch.

The receiver/rectifier module 4 furthermore comprises a dynamic control capacitor C9 and a rectifier circuit consisting of two diodes V10, V11 as well as a filter capacitor C10. The receiver coil L4 will receive the inductive energy transmitted by the oscillator transmitter module 3 and rectify this energy in the rectifier circuit V10, V11. At the output of the receiver/rectifier module 4, i.e. signal F, the energy received by the module 4 will vary in a pulsed manner in synchronism with the pulsed input signal A.

This energy is supplied to the input of the oscillator transmitter module 5, which according to FIG. 2 comprises first and second resistors R18, R19, a bipolar transistor V12, a first capacitor C11 and a transmitter oscillator circuit comprised by a second capacitor C12 connected in parallel with a transmitter coil L5, L6 having, at the center of the winding thereof, an output which is connected to the emitter of the transistor V12. The transmitter oscillator circuit L5, L6, C12 is tuned to a resonant frequency YY MHz, which is different from the resonant frequency XX MHz of the oscillator transmitter module 3 and the receiver/rectifier module 4. Preferably, the resonant frequency YY is a multiple of the resonant frequency XX, for instance YY=4 MHz and XX=1 MHz. The transmitter oscillator circuit L5, L6, C12 will start and stop in synchronism with the energy received from the receiver/rectifier module 4 (at node F). Therefore, an inductive signal (node G) transmitted by the transmitter coils L5, L6 will synchronously follow the pulsed input signal A.

As shown in FIG. 3, the inductive output signal G transmitted from the oscillator transmitter module 5 of the target is an amplitude-shift keying signal, carrying the same digital information as the input signal E received by the receiver/rectifier module 4 but having a different carrier frequency (YY as compared to XX).

The inductive signal G transmitted from the target is received at the receiver/rectifier module 6 of the proximity switch as a signal H. As shown in FIG. 2, the receiver/rectifier module 6 comprises a receiver oscillator circuit having a receiver coil L3 and a capacitor CS connected in parallel therewith. The receiver oscillator circuit L3, C5 is tuned to the same resonant frequency YY MHz as that of the oscillator transmitter module 5.

The receiver oscillator circuit L3, C5 is followed by a dynamic step having a resistor R10 and a capacitor C6, which in turn is followed by a rectifier circuit comprising two diodes V5 and V6. The output of the rectifier circuit is connected to the base terminal of a bipolar amplifying transistor V7. The output of the receiver/rectifier module 6 is supplied as a signal I at the collector terminal of the transistor V7.

Since the receiver oscillator circuit of the receiver/rectifier module 6 has a resonant frequency, which is fundamentally different from the frequency of the signal transmitted from the oscillator transmitter module 3, these signals will not interfere with each other.

The receiver/rectifier module 6 is followed by the inverter module 7, comprising (see FIG. 2) a plurality of resistors R11, R12, R13, R14, R15, R16, R17, a capacitor C7 and two bipolar transistors V8 and V9 The output J of the inverter module 7 will be the inverse of the input I thereof.

Preferably, the information logic module 8 and the information module 9 are arranged to provide an electric (M) and/or visual output indicative of whether a pulsed signal is received from the target and/or whether such a pulsed reply signal is synchronous with/equal to the pulsed input signal to the proximity switch.

To summarize the above, a pulsed input signal A sent to the proximity switch will be modulated onto a high-frequency carrier wave transmitted in the form of an inductive signal by the oscillator transmitter module 3. Only if the target is present in proximity with the proximity switch will this signal be sent back, at a fundamentally different carrier frequency, to the receiver/rectifier module 6 of the proximity switch. Consequently, provided that the target is present, the output terminal Out of the proximity switch will exhibit a pulsed signal, which has the same digital content and is synchronous with the pulsed input signal. Since the resonant circuits of the oscillator transmitter module 3 and the receiver/rectifier module 6 are tuned to fundamentally different frequencies, there is no risk of cross-talk between these modules, and a pulsed signal will only be carried through the proximity switch from input terminal In to output terminal Out, if the target is present. Since the output signal at terminal Out is the inverse of the input signal at terminal In, an accidental short circuit anywhere in the proximity switch will be detected, since the output signal will then be identical to the input signal and not the inverse thereof.

Figure 4:
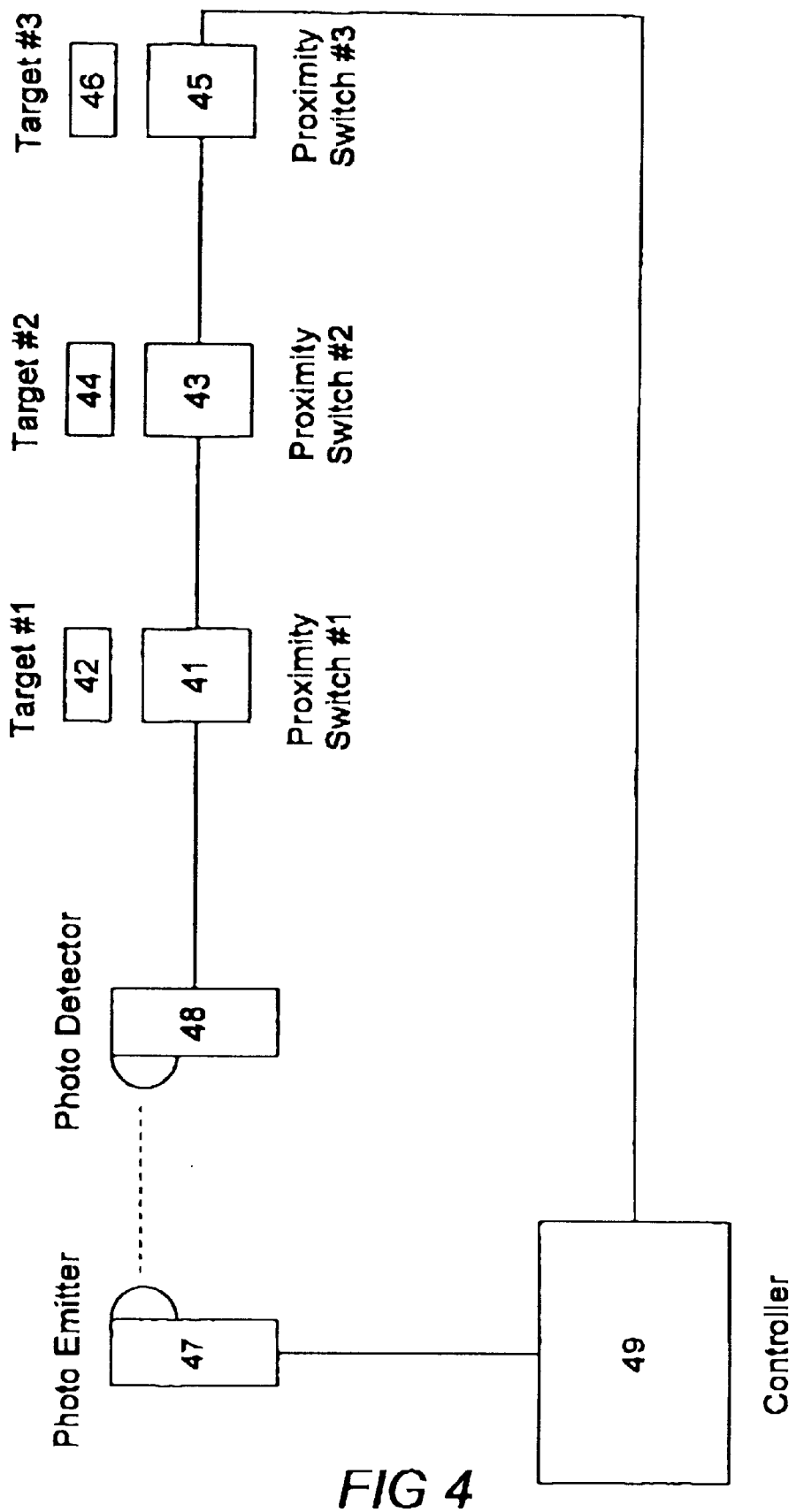
FIG. 4 is a schematic block diagram of a system of proximity switches and targets connected in cascade.

Advantageously, as shown in FIG. 4, several pairs of proximity switches/targets may be connected in cascade to individually monitor a respective movable object (door, gate, hatch, etc). In FIG. 4, a first pair of proximity switch/target 41, 42 is connected in series with a second pair 43, 44, the second pair in turn being connected in series with a third pair of proximity switch/target 45, 46. The output of the first proximity switch 41 is connected to the input of the second proximity switch 43, the output of which is connected to the input of the third proximity switch 45. The output of the third proximity switch 45 is connected to an input of a controller 49. An output of the controller 49 is connected to an input of a photo emitter 47, which is arranged to establish an optical link to a photo detector 48, an output of which is connected to the input of the first proximity switch 41. The photo emitter 47 and photo detector 48 may monitor, in a conventional way, whether an object is moved across the optical link between the emitter 47 and detector 48.

The controller 49 is arranged to transmit a pulsed digital signal having a predetermined content to the photo emitter 47, which will generate an optical signal containing said pulsed information to the photo detector 48. The photo detector 48 will receive the signal from the photo emitter 47 and will supply an electric signal, containing the pulsed digital information, to the first proximity switch 41. From there, the pulsed digital information will be transmitted to the first target 42, be retransmitted back to the first proximity switch 41, be supplied from the output of the first proximity switch 41 to the input of the second proximity switch 43, then to the second target 44, back to the second proximity switch 43, etc. After having passed also through the third proximity switch 45 and the target 46, the pulsed digital signal will be supplied to the controller 49. Only if the pulsed digital signal once transmitted to the photo emitter 47 is duly received by the controller 49 from the third proximity switch 45, will the controller 49 decide that all monitoring equipment is operative and that no dangerous action has been committed (such as interruption of the optical link between the photo emitter 47 and photo detector 48, opening of a door monitored by any of the proximity switches/targets, etc). Adjacent pairs of proximity switches/targets are tuned to fundamentally different resonant frequencies, thereby avoiding any interference between the components.

The proximity switch and target described above operate inductively. However, the pulsed digital information may be transmitted back and forth between the proximity switch and target by other means than inductive link, such as radio signals or optical signals, as is readily realized by a man skilled in the art. In such cases, it may be necessary to provide the target with an internal power source for feeding the transmitter thereof.

The invention has been described above with reference to a preferred embodiment. However, this disclosure has exemplifying but not limiting purposes, and the invention shall not be restricted to anything other than the inventive concept as defined by the appended independent patent claims. Other embodiments than the ones disclosed above are equally possible within the scope of the invention.

What is claimed is:

1. A proximity switch for detecting a target in proximity with the proximity switch, comprising:
    a wireless transmitter for transmitting a first pulsed signal having the first carrier frequency to the target,
    a wireless receiver for receiving a second pulsed signal generated by a target transmitter having a second carrier frequency different from the first carrier frequency, and
    a controller for providing an output indicative of whether a predetermined correspondence is satisfied between the first and the second pulsed signals.

2. A proximity switch as in claim 1, wherein the wireless transmitter comprises a first oscillator circuit and is adapted to receive a digital input signal and in response encode it by amplitude-shift keying, thereby producing said first pulsed signal.

3. A proximity switch as in claim 2, wherein the wireless receiver comprises a second oscillator circuit and is adapted to receive said second pulsed signal and in response decode it into a digital output code.

4. A proximity switch as in claim 3, wherein the controller is arranged to provide an output indicative of whether the digital output signal is synchronous with the digital input signal.

5. A proximity switch as in claim 1, wherein the first and second pulsed signals are inductive signals.

6. A proximity switch as in claim 1, wherein the first and second pulsed signals are radio signals.

7. A proximity switch as in claim 1, wherein the first and second pulsed signals are optical signals.

8. A target for use in combination with a proximity switch, comprising:
    a wireless receiver for receiving a first pulsed signal having a first carrier frequency from the proximity switch, and
    a wireless transmitter for transmitting a second pulsed signal having a second carrier frequency, different from the first carrier frequency, to the proximity switch, the second pulsed signal being substantially synchronous with the first pulsed signal.

9. A target at in claim 8, wherein the wireless receiver and the wireless transmitter comprise a respective oscillator circuit.

10. A target as in claim 8, further comprising a rectifier for producing from said first pulsed signal an electric signal, which is supplied to the wireless transmitter for the driving thereof.

11. A system of a proximity switch and a target wherein the proximity switch has an input terminal adapted to receive a first signal containing digital information, and a first transmitter for transmitting a second signal, containing said digital information, at a first carrier frequency;
    wherein the target has a first receiver for receiving said second signal and a second transmitter for transmitting a third signal, containing said digital information, at a second carrier frequency, different from said first carrier frequency; and
    wherein the proximity switch further comprises a second receiver for receiving said third signal and producing a fourth signal, containing said digital information, to be provided at an output terminal of the proximity switch.

12. A system according to claim 11, wherein the proximity switch further comprises a controller for providing, at a second output terminal, the second output signal indicative of whether said digital information is contained in the third signal received from the target by the second receiver of the proximity switch.

13. A system according to claim 11, wherein the proximity switch further comprises an inverter for producing at the output terminal an inverse of the fourth signal from the second receiver of the proximity switch.

14. A system as in claim 11, wherein the system further comprises at least one additional proximity switch and at least one additional target, wherein an output terminal of a first proximity switch is connected to an input terminal of a second proximity switch, thereby forming a cascade of proximity switches and targets thereby permitting the digital information contained in the first signal received at the input terminal of the first proximity switch to be transmitted to the first target, back to the first proximity switch, through the output terminal thereof to the input terminal of the second proximity switch, via the second target and back to the second proximity switch to be provided at the output terminal thereof.

15. A system according to claim 14, wherein the carrier frequencies of the first proximity switch and target are different from the carrier frequencies of the second proximity switch and target.

16. A method of determining the presence of a target by providing a proximity switch, comprising:

transmitting a first pulsed signal having a first carrier frequency from the proximity switch, receiving the first signal in the target, transmitting a second pulsed signal having a second carrier frequency, different from the first carrier frequency, from the target, receiving the second pulsed signal in the proximity switch, and determining that the target is present in response to receiving said second pulsed signal.

* * * * *